(12) United States Patent
Yang

(10) Patent No.: US 6,710,657 B2
(45) Date of Patent: Mar. 23, 2004

(54) GAIN CONTROL CIRCUIT WITH WELL-DEFINED GAIN STATES

(75) Inventor: Ming Yang, Princeton, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 09/975,849

(22) Filed: Oct. 12, 2001

(65) Prior Publication Data

US 2003/0090322 A1 May 15, 2003

(51) Int. Cl.[7] ................................................ H03F 3/45
(52) U.S. Cl. ............................... 330/254; 330/278
(58) Field of Search .............................. 330/254, 278; 327/359

(56) References Cited

U.S. PATENT DOCUMENTS

| | | | |
|---|---|---|---|
| 4,327,333 A | 4/1982 | Wilcox | 330/278 |
| 4,502,021 A | 2/1985 | Hill et al. | 330/279 |
| 5,157,350 A | 10/1992 | Rubens | 330/254 |
| 5,185,581 A | 2/1993 | Brown | 330/254 |
| 5,576,662 A | 11/1996 | Price et al. | 330/277 |
| 5,748,041 A | 5/1998 | Kimura | 330/254 |
| 5,812,029 A | 9/1998 | Prentice | 330/278 |
| 5,867,778 A | 2/1999 | Khoury et al. | 455/333 |
| 5,999,056 A * | 12/1999 | Fong | 330/278 |
| 6,163,198 A | 12/2000 | Cargill | 327/350 |
| 6,169,452 B1 | 1/2001 | Popescu et al. | 330/254 |
| 6,201,443 B1 | 3/2001 | Tanji | 330/254 |
| 6,392,487 B1 * | 5/2002 | Alexanian | 330/254 |

* cited by examiner

*Primary Examiner*—Nguyen Khanh Van
(74) *Attorney, Agent, or Firm*—Pennie & Edmonds LLP

(57) ABSTRACT

A current steering-type gain control circuit provides a non-zero minimum gain in response to readily reproducible control signal conditions and without requiring sophisticated control-signal-generating circuitry. The gain control circuit is adapted from a conventional differential pair of current-steering transistors, biased by first and second control signals respectively. To provide a well-defined non-zero minimum gain, the gain control circuit includes at least one additional current steering transistor that further steers current to the output when conducting in the minimum gain state. By further including one or more additional pairs of current steering transistors, the gain control circuit also provides a plurality of well-defined states with gains between the maximum and minimum gain values of the circuit. The minimum and intermediate gain values, may be selected by varying the physical characteristics of the current steering transistors which may be BJTs or FETs. The circuit may be implemented in a single-ended or differential configuration.

36 Claims, 3 Drawing Sheets

GAIN CONTROL CIRCUIT WITH WELL-DEFINED GAIN STATES

FIELD OF INVENTION

The present invention relates generally to gain control circuits for providing variable gain in response to control signals. More particularly, it relates to gain control circuits that include current-steering transistors and provide specific, well-defined amounts of gain without requiring elaborate control-signal-generating circuitry.

BACKGROUND OF THE INVENTION

Gain control circuits, typically implemented as automatic gain control circuits (AGCs), provide variable amplification or attenuation (i.e., gain) to an input signal. Automatic gain control circuits are often used in radio receivers to maintain a desired output signal level despite variation in the input signal level. One common type of gain control circuit employs a transconductance circuit to convert an input voltage to a current and then selectively controls current steering transistors to direct a desired amount of that current to an output load.

For example, a basic differential pair of current steering circuit may employ two matched bipolar junction transistors. The emitter terminals of the two transistors are connected together at a common node that is biased by the converted input current. The collector of the first transistor is coupled to VCC by way of an output load, while the collector of the second transistor is coupled to VCC directly. The base terminal of the first transistor receives a first gain control signal, and the base terminal of the second transistor receives a second control signal. In a maximum gain state, all of the converted current is directed through the first transistor that is coupled to the output. This requires that the first control signal be at least a certain threshold level larger than the second control signal so that the second transistor shuts off in this gain state. On the other hand, in a zero gain state, no current flows through the first transistor. In this state the second control signal must be larger than the first control signal by at least the threshold level so that the first transistor shuts off. When the control signals are equal, a middle gain state results in which half the current is directed through the first transistor. These three gain states are well-defined since they correspond to readily reproducible control signal conditions that occur when the control signals are equal or when the difference between the signals need not be exact but rather must only exceed a certain threshold. Such control signal conditions do not require elaborate and sophisticated circuitry since the control signals need not exactly differ by a specific non-zero amount to provide the corresponding gain.

At the same time, in many applications a non-zero minimum gain is required for proper operation of subsequent circuitry, such as a cascaded fixed gain amplifier circuit. In conventional current-steering gain control circuits, such as the one described above, this requires that a transistor steer a small but well-defined current to the output whenever the circuit is operating in the minimum gain state. The control signals must differ by a specific non-zero amount in order to direct the specific non-zero current to the output. However, without employing sophisticated control-signal-generating circuitry, it is difficult to provide the necessary control signals to do so. Similarly, between the minimum and maximum gain states of prior art current steering gain control circuits, it is difficult to achieve well-defined intermediate gain states that also correspond to easily reproducible control signal states.

Consequently, there is a need for a current steering-type gain control circuit that can consistently provide a non-zero minimum gain, without requiring additional complexity and cost in the control signal-generating circuitry. Such a circuit would provide additional advantages if it could also operate in a plurality of well-defined gain states that accurately and consistently provide gain values between the minimum and maximum gain levels. It would further be desirable if the well-defined minimum and intermediate gain value levels could be determined by the conductivity and physical properties of the current-steering transistors themselves, and without requiring additional circuit components or complexity.

SUMMARY OF THE INVENTION

The present invention provides a current steering-type gain control circuit capable of providing a non-zero minimum gain in response to readily reproducible control signal conditions that do not require sophisticated control-signal-generating circuitry. The gain control circuit is adapted from a conventional differential pair of current-steering transistors, biased by first and second control signals respectively, in which one of the transistors steers current that it conducts through an output and the other does not. To provide the well-defined non-zero minimum gain, the gain control circuit of the present invention includes at least one additional current steering transistor (in a single-ended implementation) that further steers current to the output when it conducts, as it does in the minimum gain state. The minimum gain value, can conveniently be selected by varying the physical characteristics—e.g., saturation currents or conductivity parameters—of the current steering transistors, which may be bipolar or field effect transistors.

Preferably, in a single-ended configuration, a transconductance circuit is used to convert an input voltage into a proportional current which is then provided to the current steering transistors. A desired amount of the transconductance current is directed to a load impedance at the output so that it can be converted back into an output voltage. In a differential configuration, the input voltage is the difference between first and second input voltage signals which are respectively converted into first and second currents by a transconductance circuit. First and second symmetrical sets of current steering transistors are then used to direct a desired proportion of the first and second currents to first and second outputs respectively.

Thus, in one embodiment, the present invention provides a gain control circuit for steering a desired amount of a first current at common node through an output. The gain control circuit comprises a first, second, and third transistor. The first transistor is coupled between the common node and the output. The first transistor has a control terminal (e.g., a base terminal for a BJT or a gate terminal for a FET) for receiving a first control signal. The second transistor is coupled to the common node and has a control terminal for receiving a second control signal. The third transistor is coupled between the common node and the output. The third transistor has a control terminal which also preferably receives the second control signal. In this manner, current conducted by the first and third transistors is steered through the output, and current conducted by the second transistor is not steered through the output.

The transistors may be bipolar junction transistors (BJTs) such as heterojunction bipolar junction transistors (HBTs).

In this case, the saturation current characteristics of the transistors are preferably not all equal, i.e., at least one transistor's characteristic differs from the others. The ratio of the saturation current characteristics of the transistors is preferably determined by the ratio of the emitter-base junction areas of the transistors. In one embodiment, the first and third transistors have saturation current characteristics that are matched, and the second transistor has a saturation current characteristic that is different from the saturation current characteristic of the first and third transistors. Alternatively, the transistors may be field effect transistors, e.g., metal semiconductor field effect transistors (MESFETs). In this case, the transistors preferably have aspect ratios characteristics that are not all equal, where the aspect ratio of a transistor is defined as the channel width W divided by the channel length L.

In one embodiment, the gain control circuit further comprises at least one additional pair of current steering transistors. The first transistor in each additional pair is coupled to the common node and has a control terminal for receiving a further control signal specific to that transistor pair. The second transistor in each additional pair is coupled between the common node and the output and has a control terminal that also receives the control signal specific to that pair. Current conducted by the first transistor in each additional pair is not steered through the output, while current conducted by the second transistor in each additional pair is steered through the output. In this manner, the gain control circuit can provide a plurality of well-defined gain values between the maximum and minimum gain of the circuit. These well-defined intermediate gain values, may also be selected and varied by changing the physical characteristics of the current steering transistors. In this embodiment, the second transistor in each additional pair may have a current characteristic that is matched to the first and third transistors, while the first transistor in each additional pair preferably has a saturation current characteristic that is different from the saturation current characteristic of any other transistor.

In another embodiment, the present invention also provides a gain control circuit similar to that described above, but in a differential configuration. The differentially configured gain control circuit comprises a first set of transistors (as above) for steering a desired amount of a first current at a first common node through a first output. Similarly, the circuit further includes a second set of transistors for steering a desired amount of a second current at a second common node through a second output. The two sets of transistors are symmetric, so that the transistors in the first set match corresponding transistors in the second set. Corresponding transistors in each set also receive the same control signals. Again, the transistors may be BJTs or FETs.

BRIEF DESCRIPTION OF THE DRAWINGS

The objects and advantages of the present invention will be better understood and more readily apparent when considered in conjunction with the following detailed description and accompanying drawings which illustrate, by way of example, preferred embodiments of the invention and in which.

DETAILED DESCRIPTION OF PREFERRED EMBODIMENTS

Figure 1:
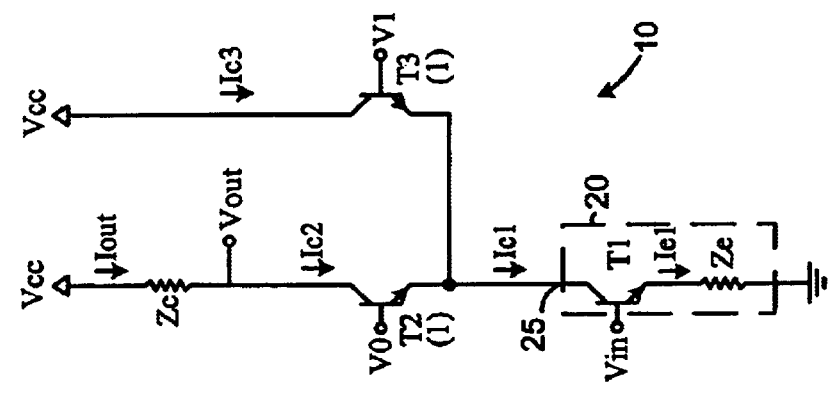
FIG. 1 is a circuit diagram of a prior art gain control circuit using two current steering bipolar junction transistors.

FIG. 1 is a circuit diagram of a prior art gain control circuit 10 including a transconductance circuit 20 and a gain control stage comprising a differential pair of current steering npn bipolar junction transistors (BJTs) T2 and T3. Transconductance circuit 20 comprises a single stage transistor T1 and a degeneration impedance Ze connected between the emitter of transistor T1 and ground (or Vee). Transconductance stage transistor T1 receives an input voltage Vin at its base, and converts that voltage into a current Ic1 at the collector of T1. The BJT transistors in circuit 10 may be heterojunction bipolar junction transistors (HBTs) made from layers of gallium arsenide and aluminum gallium arsenide and suitable for high frequency operation. In known manner, within a certain dynamic range of the input signal Vin, the current Ic1 output by circuit 20 is given as (assuming negligible base currents):

$$Ic1 = Ie1 = G_m Vin, \quad (1)$$

where $G_m$ is the transconductance gain of circuit 20. Emitter impedance Ze provides a negative or degenerative feedback effect that helps to linearize and desensitize transconductance circuit 20. Without impedance Ze, $G_m$ is effectively the intrinsic transconductance $g_m$ of transistor T1 which equals Ic/VT (where VT is the thermal voltage). With Ze, the transconductance gain of circuit 20 is reduced since $$1/G_m = 1/g_m + Ze \quad (2)$$

Because Ze is much larger than $1/g_m$, the gain can be approximated as $$G_m \approx 1/Ze \quad (3)$$

so that the collector current is given as $$Ic1 = Ie1 = G_m Vin \approx Vin/Ze. \quad (4)$$

As will be appreciated by those skilled in the art, other transconductance circuits (e.g., transconductance amplifiers having more than one transistor stage) capable of converting the input voltage Vin to a proportional current within the desired dynamic range may also be used in place of circuit 20.

Current steering transistor pair T2 and T3 are arranged in an emitter-coupled configuration, with the emitters of T2 and T3 both coupled to the output 25 of transconductance circuit 20, i.e., the collector of transistor T1. The collectors of transistors T2 and T3 are coupled to a supply voltage Vcc. As illustrated, the collector of transistor T2 is coupled to Vcc through a load impedance Zc, while the collector of transistor T3 may be coupled to Vcc directly. The base of transistor T2 receives a first control signal V0, and the base of transistor T3 receives a second control signal V1. In known manner, the current Ic2 and Ic3 generated at the collectors of each of transistors T2 and T3 is (ignoring base currents) given by $$Ic2 = Is2(e^{Vbe2/VT})$$

$$Ic3 = Is3(e^{Vbe3/VT}) \quad (5)$$

where Is2 and Is3 are the saturation currents of transistors T2 and T3 respectively, Vbe2 and Vbe3 are the base-emitter voltages of transistors T2 and T3 respectively, and VT is the thermal voltage. As will be appreciated by those skilled in the art, the saturation current of T2 and T3 is inversely proportional to the base width and directly proportional to the area of the emitter-base junction of the transistor, and therefore Is is approximately constant at a given temperature. For the purposes of the present description, it will be assumed that the ratio of the saturation currents of two bipolar transistors are dictated by the ratio of their emitter-base junction areas, and consequently that other physical device parameters (such as the base width) are matched and so do not affect the saturation current ratio. The thermal voltage is given by VT=kT/q, where k is Boltzmann's constant, T is the temperature in Kelvins, and q the magnitude of an electronic charge. As is known to those skilled in the art the thermal voltage is about 26 mV at 300K.

By selectively adjusting the difference between control signals V0 and V1, the base-emitter voltages Vbe2 and Vbe3 can be controlled to steer a desired amount of the current IC1 output by circuit 20 through transistor T2. It will be appreciated by those skilled in the art that, to maintain a proper operation point, the voltages V0 and V1 generally need to be high enough to maintain transistor T1 in transconductance circuit 20 in the active mode and low enough to avoid saturating transistor T2 when its collector voltage drops due to the output current flowing through load impedance Zc. The current Ic2 provides an output current Iout, which is converted back into an output voltage Vout at the collector of T2. In effect, the differential pair of transistors T2 and T3 act as an adjustable current attenuator in which the available signal current Ic1 at the collector of T1 is attenuated by a factor a before it flows into Zc. The output voltage Vout is given as $$Vout = -Iout \, Zc + Vcc, \quad (6)$$

and the current attenuation a provided by the current steering transistors in circuit 10 is defined as $$\alpha = Iout/Ic1 \quad (7)$$

$$= Ic2/Ic1$$

$$= Ic2/(Ic2 + Ic3)$$

so that $$Vout = -\alpha Ic1 Zc + Vcc \quad (8)$$

$$= -\alpha(Zc/Ze)Vin + Vcc$$

and the gain of circuit 10 is $$20 \log (\alpha Zc/Ze) \text{ dB}. \quad (9)$$

Gain control circuit 10 provides a maximum gain when the voltage difference V0−V1 is sufficiently positive to completely shut off transistor T3. In this state, there is no current attenuation, and all of the current output by transconductance circuit 20 flows through transistor T2, i.e., $\alpha=1$ and Iout=Ic2=Ic1. When V0>>V1, e.g., typically by 200 mV or more, this is sufficient to place circuit 10 in a maximum gain state.

To lower the gain, V0 is decreased with respect to V1. Transistors T2 and T3 are usually matched in terms of the area of their saturation currents (and their emitter-base junction areas), so that the saturation currents Is2 and Is3 of the transistors are approximately equal to one another. The matching of transistors T2 and T3, in particular their saturation currents and emitter-base junction areas, is indicated in FIG. 1 by the numbers in parentheses near each transistor which signify that the saturation currents (and emitter-base junction areas) have a ratio of 1:1. When T2 and T3 are so matched, and when the control voltages V0 and V1 are equal, the current output by transconductance circuit 20 divides equally between transistors T2 and T3, and gain control circuit 10 provides a current attenuation a of 0.5. In this state, Iout=Ic2=0.5Ic1 and that the gain is halved in comparison to the maximum gain.

At maximum attenuation, when the voltage difference V0−V1 is sufficiently negative to completely shut off transistor T2, gain control circuit 10 provides zero gain so that all of the current output by transconductance circuit 20 flows through transistor T3, $\alpha=0$, and Iout=Ic2=0. This state is entered when V1>>V0, for example by at least 200 mV.

Prior art gain control circuit 10 generally requires control circuitry (not shown) to generate proper control voltage signals V0 and V1 for accurately steering current in transistor pair T2-T3. The maximum gain provided by circuit 10 is generally well-defined, but accurate control is particularly challenging when a well-defined non-zero gain is required while the gain control circuit is operating in a minimum gain state. To provide a non-zero minimum gain, T2 should not shut off fully, but rather a small yet consistent amount of current must flow through transistor T2 when operating in this state. Even where a sophisticated circuit is employed, this is difficult to accomplish in prior art gain control circuit 10 since a well-defined non-zero minimum gain generally does not correspond to levels of control voltages V0 and V1 that are readily reproducible, unlike the zero gain state which is entered whenever V1>>V0.

Figure 2:
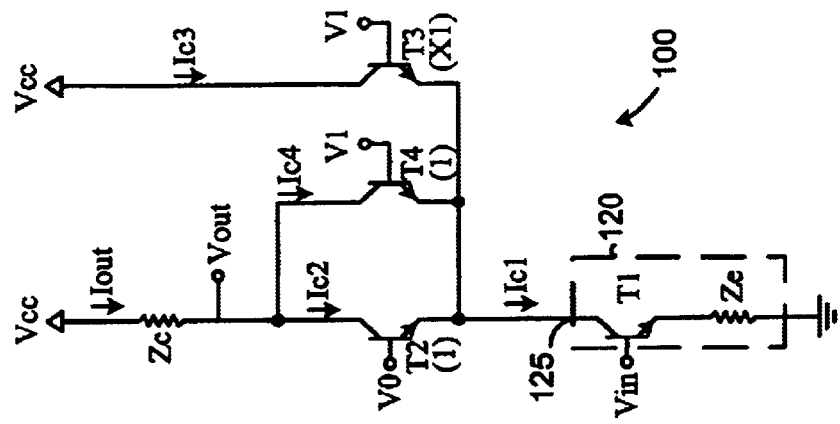
FIG. 2 is a circuit diagram of gain control circuit using current steering bipolar junction transistors in accordance with a preferred embodiment of the present invention in which a well-defined non-zero bypass current is provided to a load when the circuit is in a minimum gain state.

FIG. 2 is a circuit diagram of a gain control circuit 100 in accordance with a preferred embodiment of the present invention. Like the circuit of FIG. 1, gain control circuit 100 includes a transconductance circuit 120 comprising a transistor T1 and emitter impedance Ze for converting the input voltage Vin to a proportional current at an output 125. Again, it will be understood that any suitable transconductance circuit may be used for this purpose, and transconductance circuit 120 is merely shown by way of example. Referring to FIG. 2, in addition to the transistors T2 and T3 in circuit 10 of FIG. 1, the gain control stage in circuit 100 includes a third current steering transistor T4 that provides a current Ic4 to the load impedance Zc when circuit 100 is operating in a maximum attenuation state. As shown, the current Ic4 bypasses transistor T2 in reaching the load impedance Zc. The emitter of transistor T4 is arranged in an emitter-coupled configuration with transistors T2 and T3 so that the emitter of T4 is also coupled to the output 125 of transconductance circuit 25, i.e., the collector of transistor T1. Like transistor T2, the collector of transistor T4 is coupled to Vcc through load impedance Zc. The base of transistor T4 receives the control signal V1, similar to the base of transistor T3. As shown, gain control circuit 100 also uses BJTs as the current steering transistors T2, T3, and T4. As described in more detail below in connection with FIG. 5, field effect transistors (FETs) may also conveniently be used to perform current steering in the present invention.

As with circuit 10 in FIG. 1, the overall gain of circuit 100 (in dB) is given by 20 log($\alpha$Zc/Ze). However, since Iout=Ic2+Ic4, the current attenuation $\alpha$ is now given as $$\alpha = Iout/Ic1 \quad (10)$$
$$= (Ic2+Ic4)/Ic1$$
$$= (Ic2+Ic4)/(Ic2+Ic4+Ic3)$$

and, in view of formula (5) the current attenuation equals, $$\alpha = \frac{Is2(e^{Vbe2/VT}) + Is4(e^{Vbe4/VT})}{Is2(e^{Vbe2/VT}) + Is4(e^{Vbe4/VT}) + Is3(e^{Vbe3/VT})} \quad (11)$$

When V0>>V1, the maximum gain ($\alpha$=1) state of circuit 100 operates similarly to the maximum gain state of circuit 10 in FIG. 1. In this state, transistor T3 and T4 are both off and all of the current Ic1 output by circuit 120 flows through T2 and hence into load impedance Zc, i.e., Iout=Ic2=Ic1. To lower the gain, V0 is decreased with respect to V1, and when transistor T4 is no longer in an off state, the output current Iout is now equal to the sum of Ic2 and Ic4. When this occurs, Iout depends not only on the control voltages V0 and V1, but also on the saturation currents of each of T2, T3, and T4.

In the illustrated embodiment of FIG. 2, transistors T2 and T4 are matched, i.e. have equal saturation currents (and emitter-base junction areas), whereas transistor T3 has a saturation current (and emitter-base junction area) that is X1 times the saturation current (and emitter-base junction area) of T2 and T4, where X1>0. Again, the ratios of the emitter-base junction area of transistors T2, T3, and T4—and consequently the ratio of their saturation currents (assuming other relevant parameters are matched)—are indicated in FIG. 2 by the numbers in parentheses near each transistor. Thus, with Is=Is2=Is4, and since Vbe3=Vbe4, the current attenuation in gain control circuit 100 is $$\alpha = [Is(e^{Vbe2/VT} + e^{Vbe4/VT})]/[Is(e^{Vbe2/VT} + (1+X1)e^{Vbe4/VT})] \quad (12)$$
$$= [e^{Vbe2/VT} + e^{Vbe4/VT}]/[e^{Vbe2/VT} + (1+X1)e^{Vbe4/VT}]$$

At maximum attenuation, when V1>>V0 so that the voltage difference V0−V1 is sufficiently negative to shut off transistor T2 (Ic2=0), transistor T4 continues to provide a bypass current to Iout (i.e., Iout=Ic4) so that the maximum current attenuation becomes $$\alpha=1/(1+X1) \quad (13)$$

and gain control circuit 100 provides a well-defined non-zero minimum gain equal to $$20 \log[Zc/(Ze(1+X1))] \text{ dB} \quad (14)$$

Thus, by varying the value of X1, a desired minimum gain value can be selected for circuit 100 that is less than the maximum gain by the factor of 1/(1+X1). As will be appreciated, circuit 100 can be used as a continuously adjustable gain control circuit in which the voltage difference V0−V1 can be continuously varied between the maximum gain state in which V0>>V1 and the minimum gain state in which V1>>V0. Gain control circuit 100 thereby provides a continuous range of gain between the maximum and minimum gain values. Alternatively, in some applications, circuit 100 may be operated as a step gain control circuit by limiting possible control voltage signals to those corresponding to the maximum and minimum gain states.

It will also be appreciated that the saturation currents (and emitter-base junction areas) of transistors T2 and T4 may also (or alternatively) be selected to differ from one another to provide additional flexibility in the range of gain values in circuit 100. Furthermore, in an alternative embodiment (not shown), instead of the signal V1, bypass transistor T4 may receive a third control signal at its base. In this embodiment, the additional control signal represents a further degree of freedom in terms of control, but at the expense of having to generate the additional control signal in related control circuitry (not shown).

Figure 3:
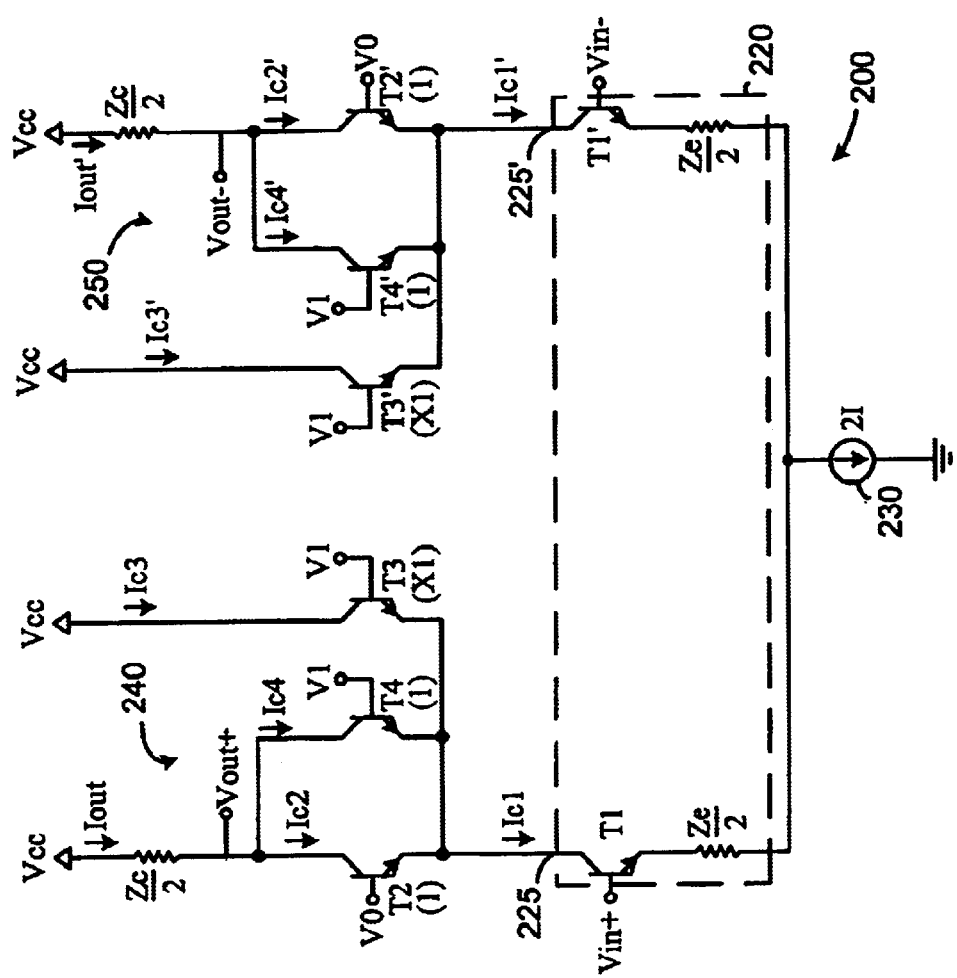
FIG. 3 is a circuit diagram of a differential version of the single-ended gain control circuit of FIG. 2 in accordance with another embodiment of the present invention.

As illustrated in FIG. 2, gain control circuit 100 is implemented in a single-ended configuration in which both the input signal Vin and output signal Vout are taken with respect to ground. However, the gain control circuit of the present invention may also be readily implemented in a differential configuration. FIG. 3 is a circuit diagram of a differential gain control circuit 200 that receives a differential input as the difference between two input signals Vin+ and Vin− and, in response, provides a differential output as the difference between two output signals Vout+ and Vout−. Referring to FIG. 3, circuit 200 is generally symmetric and includes a transconductance circuit 220 having a first transistor T1 with emitter impedance Ze/2 and a second transistor T1' also with emitter impedance Ze/2. The base of transistor T1 receives the first input signal Vin+ and the base of transistor T2 receives the second input signal Vin−. As shown, the emitters of transistors T1 and T1' are coupled, through their respective emitter impedances, to a current sink circuit 230 that sinks a constant current 2I from the emitter terminal. Transconductance circuit 220 converts the differential voltage between Vin+ and Vin− into a first current Ic1 at 225 (i.e., the collector of T1) and a second output current Ic1' at 225 (i.e., the collector of T1), where Ic1+Ic1'=2I.

Due to its differential configuration, gain control circuit 200 provides improved common mode rejection compared to the single ended embodiment of circuit 100 in FIG. 2. Furthermore, with the inclusion of current sink circuit 230, the current consumption within circuit 200 can be readily controlled. Again, it will be understood that any suitable transconductance circuit may be used to generate currents Ic1 and Ic1' so that they are proportional to the input signals Vin+ and Vin− respectively within a desired range input dynamic range. For example, instead of the common current sink circuit 230, two separate current sink sources (not shown) may be coupled between the ground terminal and the emitters of each of transistors T1 and T1' respectively.

Referring to FIG. 3, the current Ic1 is input to a first set 240 of current steering transistors T2, T3, and T4 that operate as described above in connection with gain control circuit 100 in FIG. 2. Similarly, the current Ic1' is input to a second symmetrical set 250 of current steering transistors T2', T3', and T4' that also operate in a similar manner to the current steering transistors in FIG. 2. As shown, the bases of transistors T2 and T2' receive the control voltage V0 and the bases of transistors T3, T3', T4, and T4' receive the control voltage V1. In response to the control voltages V0 and V1, the first set of transistors 240 steers a current Iout=Ic2+Ic4 through a load impedance Zc/2, and the second set of transistors 250 steers a current Iout'=Ic2'+Ic4' through a load impedance $Zc/2$. The output currents Iout and Iout' are converted back into a double-ended output voltage, where the first output end signal Vout+ is taken at the collector of T2 and the second output end signal Vout− is taken at the collector of T2'.

In the illustrated embodiment of FIG. 3, the saturation currents (and emitter-base junction areas) of T2, T2', T4, and T4' are equal, and the saturation current (and emitter-base junction areas) of T3 and T3' are each equal to X1 (X1>0) times the saturation current of T2, T3', T4, and T4'. As a result, the current attenuation a provided by each set 240 and 350 of current steering transistors on Iout and Iout' respectively is the same, and therefore $$Vout = (Vout+) - (Vout-) \quad (15)$$
$$= [-\alpha(Ze/2)Ic1 + Vcc] - [-\alpha(Zc/2)Ic1' + Vcc]$$
$$= -\alpha(Zc/2)[Ic1 - Ic1']$$
$$= -\alpha(Zc/2)[(Vin+)/(Ze/2) - (Vin-)/(Ze/2)]$$
$$= -\alpha(Zc/Ze)Vin$$

Thus, like gain control circuit 100, the gain of circuit 200 is given as $$20 \log[\alpha Zc/Ze] \text{ dB}, \quad (16)$$

and a well-defined minimum gain of $$20 \log[Zc/(Ze(1+X1))] \text{ dB} \quad (17)$$

is provided when $V1 \gg V0$ and $\alpha = 1/(1+X1)$.

Thus, by including one additional bypass-connected current steering transistor in a single-ended configuration (T4 in FIG. 2)—or two additional bypass-connected transistors in a differential configuration (T4 and T4' in FIG. 3)—the gain control circuit of the present invention advantageously provides a reproducible and well-defined non-zero minimum gain, the value of which can conveniently be selected based on the physical characteristics of the current steering transistors. The maximum gain similarly corresponds to control signal conditions that are easily reproduced, and therefore operates as a well-defined gain state. Again, the voltage difference V0−V1 can be continuously varied between the maximum gain state in which $V0 \gg V1$ and the minimum gain state in which $V1 \gg V0$ to provide a continuous range of gain values.

Figure 4:
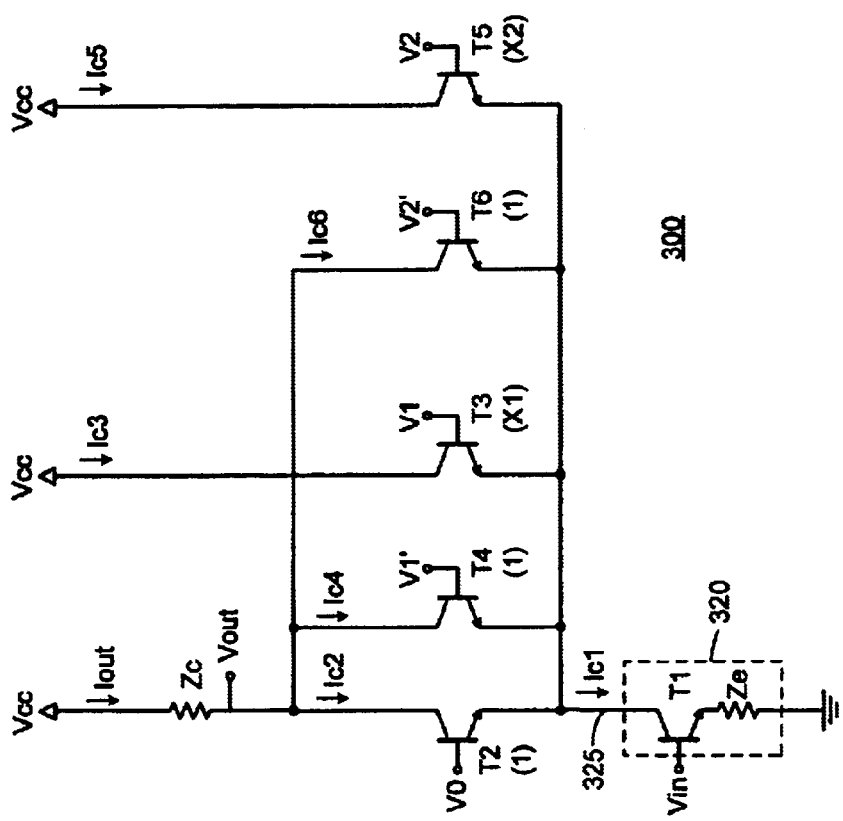
FIG. 4 is a circuit diagram of a further embodiment in which the gain control circuit of FIG. 2 is adapted to include an additional pair of current steering transistors that enable well-defined intermediate gain states, between the maximum and minimum gain states, to be provided.

In accordance with another embodiment of the present invention, by including one or more additional pairs of current steering transistors—with each transistor in the pair controlled by a further control signal—the gain control circuit may also provide a plurality of well-defined states with gains between the maximum and minimum gain values. FIG. 4 is a circuit diagram of a gain control circuit 300 including the current steering transistors T2, T3, and T4 of circuit 100 in FIG. 2 and an additional pair of current steering transistors T5 and T6. Although gain control circuit 300 is implemented in a single ended configuration, it may be readily converted into a differential input/output signal configuration, in a manner similar to that described above in connection with FIG. 3. In this case, the differential gain control circuit would further include a second additional pair of transistors (not shown) symmetrical to T5 and T6.

Referring to FIG. 4, transistors T5 and T6 are arranged in an emitter-coupled configuration with transistors T2, T3, and T4, and so the emitters of T5 and T6 are also coupled to the collector of transistor T1, i.e., the output 325 of a transconductance circuit 320. Similar to the transconductance circuit 120 in FIG. 2, transconductance circuit 320 may include a transistor T1 with associated degenerative emitter impedance Ze, as shown. Like transistors T2 and T4, the collector of transistor T6 is coupled to Vcc through load impedance Zc. As shown in FIG. 4, the collector of transistor T5 may be coupled to Vcc directly, similar to transistor T3. The base of transistor T5 is connected to a third control signal, V2. The base of transistor T6 is connected to control signal V2'. The prime notation on the control signal indicates that V2' is similar to V2 such that the conditions for V2 shown in Table 1 below also apply V2'. For example, if $V0 \gg V2$, then $V0 \gg V2'$ is also true. Similarly, the control signal for transistor T4 is V1' thereby indicating that the conditions shown in Table 1 below for V1 also to V1'. In some embodiments, the base of transistor T5 and the base of transistor T6 are each connected to a third control signal V2 so that V2'=V2, Similarly, in some embodiments V1'=V1. The overall gain of circuit 300 (in dB) remains $20 \log(\alpha Zc/Ze)$. However, since $Iout = Ic2 + Ic4 + Ic6$, the current attenuation a is now given as $$\alpha = Iout/Ic1 \quad (18)$$
$$= (Ic2 + Ic4 + Ic6)/Ic1$$
$$= (Ic2 + Ic4 + Ic6)/(Ic2 + Ic4 + Ic6 + Ic3 + Ic5)$$

The determination of the collector currents in each of transistors T2, T3, T4, T5, and T6 now depends on the relative voltage differences between the three control signals V0, V1, and V2, i.e., the voltages V0−V1, V0−V2, and V1−V2. Gain control circuit 300 may operate in one of a plurality of well-defined gain states depending on whether the differential control voltages V0−V1, V0−V2, and V1−V2 have a high value (e.g., 200 mV or more), a zero value, or a low value (e.g., −200 mV or less). In the illustrated embodiment of FIG. 4, the saturation currents (and emitter-base junction areas) of T2, T4, and T6 are equal. The saturation current of T3 is X1 times the saturation current of T2, T4, and T6, whereas the saturation current of T5 is X2 times the saturation current of T2, T4, and T6 (again, X1>0 and X2>0). In this particular embodiment, the current attenuation a in each of a plurality of well-defined gain states is as listed in Table I below.

TABLE I

| V0−V1 | V0−V2 | V1−V2 | Attenuation ($\alpha$) | Conditions/Gain State |
|---|---|---|---|---|
| high | high | — | 1 | V0 >> V1, V0 >> V2; maximum gain state; T2 is on |
| low | — | high | 1/(1 + X1) | V1 >> V0, V1 >> V2; minimum gain state if X1 > X2; T3 and T4 are on |
| — | low | low | 1/(1 + X2) | V2 >> V0, V2 >> V1; minimum gain state if X2 > X1; T5 and T6 are on |
| zero | high | high | 2/(2 + X1) | V0 = V1 >> V2; intermediate gain state T2, T3, and T4 are on |
| high | zero | low | 2/(2 + X2) | V0 = V2 >> V1; intermediate gain state T2, T5, and T6 are on |

TABLE I-continued

| V0–V1 | V0–V2 | V1–V2 | Attenuation (α) | Conditions/Gain State |
|---|---|---|---|---|
| low | low | zero | 2/(2 + X1 + X2) | V1 = V2 >> V0; intermediate gain state T3, T4, T5, and T6 are on |
| zero | zero | zero | 3/(3 + X1 + X2) | V0 = V1 = V2; intermediate gain state T2, T3, T4, T5, and T6 are on |

The saturation currents (and emitter-base junction areas) of transistors T2, T4, and/or T6 in FIG. 4 may also (or alternatively) be selected to differ from one another to provide further flexibility in the range of well-defined gain values provided by circuit 300. Moreover, still more transistor pairs (similar to T3-T4 and T5-T6) can be added to the gain control circuit to provide an even greater number of well-defined intermediate gain states. Each additional transistor pair is preferably controlled by a corresponding additional control signal. Therefore, it will be appreciated that the control circuitry for generating the control signals becomes more complex as more current steering transistor pairs are added, and this may also affect the high frequency performance of the overall circuit.

As with the other circuits described above, gain control circuit 300 is capable of providing a continuous range of gain values between any two of the well-defined gain states of the circuit. This is accomplished by appropriately varying one or more of the differential control voltages V0–V1, V0–V2 and V1–V2. In one application of the present invention, a programmable gain control circuit uses a digital-like control step to place the circuit in a well-defined gain state and thereby obtain a coarse adjustment of the gain to within a desired range. For example, to provide each of the well-defined gain states in Table I, V0, V1, and V2 may be "discretized" in high (1) and low (0) states, as specified in Table II below. (The difference between the high and low states must exceed a certain threshold, e.g., 200 mV, and actual voltage values must generally meet other criteria such as being sufficiently high to maintain transistor T1 in transconductance circuit 320 in an active mode.) After the coarse adjustment step, a continuous adjustment step may be used to fine tune the gain to a desired value.

TABLE II

| V0–V1 | V0–V2 | V1–V2 | V0 | V1 | V2 |
|---|---|---|---|---|---|
| high | high | zero | 1 | 0 | 0 |
| low | zero | high | 0 | 1 | 0 |
| zero | low | low | 0 | 0 | 1 |
| zero | high | high | 1 | 1 | 0 |
| high | zero | low | 1 | 0 | 1 |
| low | low | zero | 0 | 1 | 1 |
| zero | zero | zero | 1 | 1 | 1 |
|  |  |  | 0 | 0 | 0 |

In all of the above described embodiments, bipolar junction transistors are used as the current steering transistors. However, the gain control circuit of the present invention can more generally be implemented using any type of transistor, including field effect transistors (FETs) such as metal semiconductor field effect transistors (MESFETs), metal oxide semiconductor field effect transistors (MOSFETs), junction field effect transistors (JFETs), or modulation doped field effect transistors (MODFETs).

Figure 5:
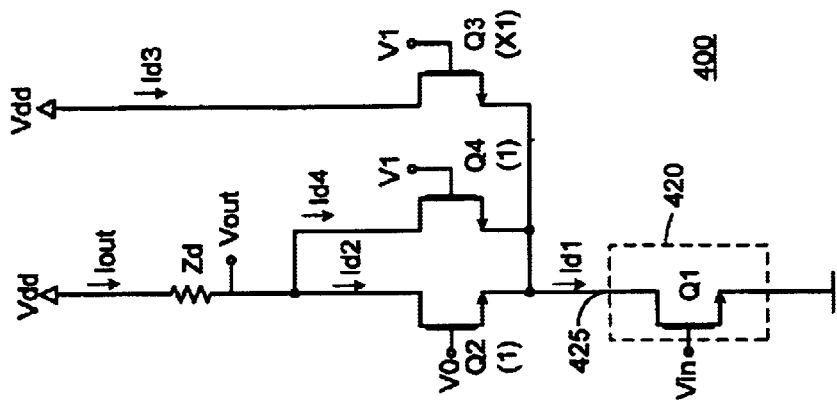
FIG. 5 is a circuit diagram of a gain control circuit in accordance with another embodiment in which the current steering transistors are metal semiconductor field effect transistors.

For example, FIG. 5 is a circuit diagram of a gain control circuit 400, having a configuration similar to circuit 100 in FIG. 2 but using n-channel metal semiconductor field effect transistors (MESFETs). As is well known to those skilled in the art, a MESFET has a conducting channel between source and drain contact regions, and carrier flow is controlled by a gate terminal which forms a Schottky barrier diode with the channel. The channel is depleted by reverse biasing the diode similar to a JFET. The MESFET transistors in circuit 400 are preferably gallium arsenide-based, since such devices are particularly suitable for high frequency applications.

In known manner, when a MESFET transistor operates in its pinch-off (i.e., saturation) region, the drain current Id is substantially independent of the drain-to-source voltage and is given by the square law $$Id \approx Idss(1 - Vgs/Vp)^2 \qquad (19)$$

Where Vgs is the gate-to-source voltage, Idss is the drain-to-source saturation current of the MESFET, and Vp is the pinch-off voltage. The pinch-off voltage Vp is negative for an n-channel MESFET, and, within the pinch-off (saturation) region, Vgs typically in the range: $Vp \leq Vgs \leq 0$. The parameters Idss and Vp are characteristics of a particular MESFET, and in particular $$Idss \propto (W/L) \qquad (20)$$

where W/L is the ratio of the width of the channel to the length of the channel in the transistor. (The ratio W/L is referred to herein as the "aspect ratio" of the transistor.) For transistors manufactured using a common integrated circuit fabrication process, the other characteristics that determine the value of Idss (such as the electron mobility in the n-channel of the transistor) are generally the same, and therefore the ratio of Idss values for different MESFETs on the same integrated circuit generally corresponds to the ratio of the W/L parameter for each transistor.

Referring to FIG. 5, gain control circuit 400 includes a transconductance circuit 420 that receives the input voltage Vin and converts it into a current Id1 at an output 425. Again, transconductance circuit 420 may comprise a single stage transistor Q1, which in this case is an n-channel MESFET transistor having a gate terminal for receiving the input Vin and a drain terminal for generating a current Id1 in response. Transconductance circuit 420 preferably does not include a source degeneration impedance at the source of Q1, since typically the intrinsic transconductance of the FET transistor is relatively low, making a further reduction in transconductance gain undesirable. Assuming transistor Q1 is biased in the pinch-off region, $$Id1 \approx g_m Vin \qquad (21)$$

where Vin is the voltage between the gate and source terminals of Q1 and $g_m$ is the intrinsic transconductance of Q1 and, as described above, is proportional to the aspect ratio, W/L, for Q1.

As shown in FIG. 5, gain control circuit 400 includes three current steering MESFET transistors Q2, Q3, and Q4 in a source-coupled configuration in which the source of each transistor is connected to the output 425 of transconductance circuit 420. The drain terminals of transistors Q2 and Q4 are connected to a supply voltage Vdd through a load impedance Zd, while the drain terminal of transistor Q3 may be coupled directly to Vdd as shown. The gate of transistor Q2 receives a first control signal V0 and the gates of transistors Q3 and Q4 each receive a second control signal V1. An attenuated output current Iout=Id2+Id4 is converted back into an output voltage Vout at the drain terminal of Q2 (and Q4). The current attenuation of gain control circuit 400 is $$\alpha = Iout/Id1 \quad (22)$$
$$= (Id2 + Id4)/Id1$$
$$= (Id2 + Id4)/(Id2 + Id4 + Id3)$$

Thus, similar to circuit 100 in FIG. 2, to control the conduction of Q2, Q3, and Q4, the control signals V0 and V1 are varied to provide a desired bias voltage between the gate and source terminals of those transistors.

As indicated, for a given integrated circuit fabrication process, the ratio of the drain-to-source saturation currents (Idss) of the transistors generally corresponds to the ratio of the different W/L parameters of the transistors. Thus, similar to varying the emitter-base junction areas of the BJTs in FIGS. 2–4, the parameter W/L—or aspect ratio—of the MESFET transistors Q2, Q3, and Q4 may also be varied to provide a desired minimum gain value. In the illustrated embodiment of FIG. 5, the aspect ratios of Q2 and Q4 are equal and the aspect ratio of Q3 is X1 times that of Q2 (and Q4) where X1>0. Thus, as with circuit 100 in FIG. 2, in the minimum gain state of circuit 400 when V1>>V0, the current attenuation is $$\alpha = 1/(1+X1) \quad (23)$$

As will be appreciated by those skilled in the art, where the gain control circuit of the present invention includes other types of field effect transistors, the minimum gain state may also be selected based on the aspect ratios of the transistors, since the relevant transistor characteristics for determining the drain current in a saturation mode—e.g., the drain-to-source saturation current for a JFET or the conductivity parameter for a MOSFET—are also directly proportional to the aspect ratios of such devices.

Furthermore, it will also be appreciated that a single-ended circuit implementation is shown in FIG. 5 for simplicity of discussion, and that differential configurations may also be provided. Similarly, additional pairs of transistors, biased by additional control signals, may also be added to gain control circuit 400 to provide well-defined intermediate gain states as described in connection with FIG. 4 above.

While the invention has been described in conjunction with specific embodiments, it is evident that numerous alternatives, modifications, and variations will be apparent to those skilled in the art in light of the foregoing description.

What is claimed is:

1. A gain control circuit for steering a desired amount of a first current at a common node through an output, the gain control circuit comprising:
    a first transistor coupled between the common node and the output, the first transistor having a control terminal for receiving a first control signal;
    a second transistor coupled to the common node and having a control terminal for receiving a second control signal;
    a third transistor coupled between the common node and the output, the third transistor having a control terminal for receiving the second control signal;
    wherein current conducted by the first and third transistors is steered through the output and current conducted by the second transistor is not steered through the output; and
    at least one pair of additional transistors wherein, for each pair,
        the first transistor in said pair is coupled to the common node and has a control terminal for receiving a control signal specific to said pair, and
        the second transistor in said pair is coupled between the common node and the output and has a control terminal for receiving the control signal specific to said pair,
        wherein current conducted by the first transistor in said pair is not steered through the output and current conducted by the second transistor in said pair is steered through the output.

2. The circuit of claim 1 wherein the transistors are all bipolar junction transistors.

3. The circuit of claim 2 wherein:
    the first transistor has an emitter terminal coupled to the common node, a collector terminal coupled through the output to a reference voltage, and a base terminal for receiving the first control signal;
    the second transistor has an emitter terminal coupled to the common node, a collector terminal coupled to the reference voltage, and a base terminal for receiving the second control signal; and
    the third transistor has an emitter terminal coupled to the common node, a collector terminal coupled through the output to the reference voltage, and a base terminal for receiving the second control signal.

4. The circuit of claim 2 wherein the first, second, and third transistors have saturation current characteristics that are not all equal.

5. The circuit of claim 4 wherein the first and third transistors have saturation current characteristics that are matched, and the second transistor has a saturation current characteristic that is different from the saturation current characteristic of the first and third transistors.

6. The circuit of claim 4 wherein the ratio of the saturation current characteristics of the transistors is determined by the ratio of emitter-base junction areas of the transistors.

7. The circuit of claim 1 wherein the transistors are all field effect transistors.

8. The circuit of claim 7 wherein
    the first transistor has a source terminal coupled to the common node, a drain terminal coupled through the output to a reference voltage, and a gate terminal for receiving the first control signal;
    the second transistor has a source terminal coupled to the common node, a drain terminal coupled to the reference voltage, and a gate terminal for receiving the second control signal; and
    the third transistor has a source terminal coupled to the common node, a drain terminal coupled through the output to the reference voltage, and a gate terminal for receiving the second control signal.

9. The circuit of claim 7 wherein the first, second, and third transistors have aspect ratio characteristics that are not all equal.

10. The circuit of claim 9 wherein the first and third transistors have aspect ratio characteristics that are matched, and the second transistor has an aspect ratio characteristic that is different from the aspect ratio characteristic of the first and third transistors.

11. The circuit of claim 9 wherein the first, second, and third transistors are metal semiconductor field effect transistors.

12. The circuit of claim 1 further comprising a transconductance circuit for receiving an input voltage and converting the input voltage into the first current at the common node, and wherein the output comprises a load impedance, and the gain control circuit provides an output voltage at a node between the first transistor and the load impedance.

13. The circuit of claim 2 wherein
the first transistor has an emitter terminal coupled to the common node, a collector terminal coupled through the output to a reference voltage, and a base terminal for receiving the first control signal;
the second transistor has an emitter terminal coupled to the common node, a collector terminal coupled to the reference voltage, and a base terminal for receiving the second control signal;
the third transistor has an emitter terminal coupled to the common node, a collector terminal coupled through the output to the reference voltage, and a base terminal for receiving the second control signal; and
for each pair in the at least one pair of additional transistors,
the first transistor in said pair has an emitter terminal coupled to the common node, a collector terminal coupled to the reference voltage, and a base terminal for receiving the control signal specific to said pair, and
the second transistor in said pair has an emitter terminal coupled to the common node, a collector terminal coupled through the output to the reference voltage, and a base terminal for receiving the control signal specific to said pair.

14. The circuit of claim 2 wherein
the first transistor, the third transistor, and the second transistor in each pair of the at least one pair of additional transistors have saturation current characteristics that are matched,
the second transistor has a saturation current characteristic that is different from the saturation current characteristic of any other transistor, and
the first transistor in each pair of the at least one pair of additional transistors has a saturation current characteristic that is different from the saturation current characteristic of any other transistor.

15. The circuit of claim 14 wherein the ratio of the saturation current characteristics of the transistors is determined by the ratio of emitter-base junction areas of the transistors.

16. The circuit of claim 7 wherein
the first transistor has a source terminal coupled to the common node, a drain terminal coupled through the output to a reference voltage, and a gate terminal for receiving the first control signal;
the second transistor has a source terminal coupled to the common node, a drain terminal coupled to the reference voltage, and a gate terminal for receiving the second control signal;
the third transistor has a source terminal coupled to the common node, a drain terminal coupled through the output to the reference voltage, and a gate terminal for receiving the second control signal; and
for each pair in the at least one pair of additional transistors,
the first transistor in said pair has a source terminal coupled to the common node, a drain terminal coupled to the reference voltage, and a gate terminal for receiving the control signal specific to said pair, and
the second transistor in said pair has a source terminal coupled to the common node, a drain terminal coupled through the output to the reference voltage, and a gate terminal for receiving the control signal specific to said pair.

17. The circuit of claim 7 wherein
the first transistor, the third transistor, and the second transistor in each pair of the at least one pair of additional transistors all have aspect ratio characteristics that are matched,
the second transistor has an aspect ratio characteristic that is different from the aspect ratio characteristic of any other transistor, and
the first transistor in each pair of the at least one pair of additional transistors has an aspect ratio characteristic that is different from the aspect ratio of any other transistor.

18. The circuit of claim 17 wherein transistors are metal semiconductor field effect transistors.

19. A gain control circuit for steering a desired amount of a first current at a first common node through a first output and for steering a desired amount of a second current at a second common node through a second output, the gain control circuit comprising:
a first set of transistors including
a first transistor coupled between the first common node and the first output, the first transistor having a control terminal for receiving a first control signal;
a second transistor coupled to the first common node and having a control terminal for receiving a second control signal; and
a third transistor coupled between the first common node and the first output, the third transistor having a control terminal for receiving the second control signal;
wherein current conducted by the first and third transistors is steered through the first output and current conducted by the second transistor is not steered through the first output;
a second set of transistors including
a first transistor coupled between the second common node and the second output, the first transistor having a control terminal for receiving the first control signal;
a second transistor coupled to the second common node and having a control terminal for receiving the second control signal; and
a third transistor coupled between the second common node and the second output, the third transistor having a control terminal for receiving the second control signal;
wherein current conducted by the first and third transistors is steered through the second output and current conducted by the second transistor is not steered through the second output; and
at least one first pair of additional transistors in the first set and corresponding second pair of additional transistors in the second set, wherein,
for each first pair of additional transistors in the first set,
the first transistor in said first pair is coupled to the first common node and has a control terminal for receiving a control signal specific to said first and second pair, and
the second transistor in said first pair is coupled between the first common node and the first output and has a control terminal for receiving the control specific to said first and second pair, wherein current conducted by the first transistor in said first pair is not steered through the first output and current conducted by the second transistor in said first pair is steered through the first output; and for each second pair of additional transistors in the second set, the first transistor in said second pair is coupled to the second common node and has a control terminal for receiving the control signal specific to said first and second pair, and the second transistor in said second pair is coupled between the second common node and the second output and has a control terminal for receiving the control specific to said first and second pair, wherein current conducted by the first transistor in said second pair is not steered through the second output and current conducted by the second transistor in said second pair is steered through the second output.

20. The circuit of claim 19 wherein the transistors are all bipolar junction transistors.

21. The circuit of claim 20 wherein
in the first set of transistors
the first transistor has an emitter terminal coupled to the first common node, a collector terminal coupled through the first output to a reference voltage, and a base terminal for receiving the first control signal;
the second transistor has an emitter terminal coupled to the first common node, a collector terminal coupled to the reference voltage, and a base terminal for receiving the second control signal; and
the third transistor has an emitter terminal coupled to the first common node, a collector terminal coupled through the first output to the reference voltage, and a base terminal for receiving the second control signal; and
in the second set of transistors
the first transistor has an emitter terminal coupled to the second common node, a collector terminal coupled through the second output to a reference voltage, and a base terminal for receiving the first control signal;
the second transistor has an emitter terminal coupled to the second common node, a collector terminal coupled to the reference voltage, and a base terminal for receiving the second control signal; and
the third transistor has an emitter terminal coupled to the second common node, a collector terminal coupled through the second output to the reference voltage, and a base terminal for receiving the second control signal.

22. The circuit of claim 21 wherein the first, second, and third transistors in the first set have saturation current characteristics that match the saturation current characteristics of the first, second, and third transistors in the second set, respectively; and wherein, in each set, the saturation current characteristics of the first, second, and third transistors are not all equal.

23. The circuit of claim 19 wherein the transistors are all field effect transistors.

24. The circuit of claim 23 wherein
in the first set of transistors
the first transistor has a source terminal coupled to the first common node, a drain terminal coupled through the first output to a reference voltage, and a gate terminal for receiving the first control signal;
the second transistor has a source terminal coupled to the first common node, a drain terminal coupled to the reference voltage, and a gate terminal for receiving the second control signal; and
the third transistor has a source terminal coupled to the first common node, a drain terminal coupled through the first output to the reference voltage, and a gate terminal for receiving the second control signal; and
in the second set of transistors
the first transistor has a source terminal coupled to the second common node, a drain terminal coupled through the second output to a reference voltage, and a gate terminal for receiving the first control signal;
the second transistor has a source terminal coupled to the second common node, a drain terminal coupled to the reference voltage, and a gate terminal for receiving the second control signal; and
the third transistor has a source terminal coupled to the second common node, a drain terminal coupled through the second output to the reference voltage, and a gate terminal for receiving the second control signal.

25. The circuit of claim 23 wherein the first, second, and third transistors in the first set have aspect ratio characteristics that match the aspect ratio characteristics of the first, second, and third transistors in the second set, respectively, and wherein, in each set, the aspect ratio characteristics of the first, second, and third transistors are not all equal.

26. The circuit of claim 19 further comprising a transconductance circuit for receiving a differential input as the difference between a first input voltage signal and second input voltage signal, the transconductance circuit converting the first input voltage into the first current at the first common node and converting the second input voltage into the second current at the second common node.

27. The circuit of claim 26 wherein the first output includes a first load impedance and the second output includes a second load impedance, and the gain control circuit provides a differential output as the difference between a first output voltage signal and a second output voltage signal, the first output voltage signal being taken at a node between the first transistor in the first set and the first load impedance and the second output voltage signal being taken at a node between the first transistor in the second set and the second load impedance.

28. The circuit of claim 19 wherein the transistors are all bipolar junction transistors and the transistors in the first set have saturation current characteristics that match the saturation current characteristics of the transistors in the second set; and wherein, in each set, the saturation current characteristics of the transistors are not all equal.

29. The circuit of claim 28 wherein the ratio of the saturation current characteristics of the transistors is determined by the ratio of emitter-base junction areas of the transistors.

30. The circuit of claim 19 wherein the transistors are all field effect transistors and the transistors in the first set have aspect ratio characteristics that match the aspect ratio characteristics of the transistors in the second set; and wherein, in each set, the aspect ratio characteristics of the transistors are not all equal.

31. A gain control circuit for steering a desired amount of current at a common node through an output, the gain control circuit comprising:
a first transistor coupled between the common node and the output, the first transistor having a control terminal for receiving a first control signal;
a second transistor coupled to the common node and having a control terminal for receiving a second control signal; and a third transistor coupled between the common node and the output, the third transistor having a control terminal for receiving a third control signal;

wherein current conducted by the first and third transistors is steered through the output and current conducted by the second transistor is not steered through the output.

32. The circuit of claim 31 wherein the first, second, and third transistors are bipolar junction transistors and have saturation current characteristics that are not all equal.

33. The circuit of claim 31 wherein the first, second, and third transistors are field effect transistors and have aspect ratio characteristics that are not all equal.

34. The circuit of claim 31 further comprising a fourth transistor coupled to the common node and having a control terminal for receiving a fourth control signal, and a fifth transistor coupled between the common node and the output and having a control terminal for receiving a fifth control signal, wherein current conducted by the fourth transistor is not steered through the output and current conducted by the fifth transistor is steered through the output.

35. The circuit of claim 34 wherein the first, second, third, fourth, and fifth transistors are bipolar junction transistors and have saturation current characteristics that are not all equal.

36. The circuit of claim 34 wherein the first, second, third, fourth, and fifth transistors are field effect transistors and have aspect ratio characteristics that are not all equal.

* * * * *